United States Patent
Lee et al.

(10) Patent No.: US 10,523,215 B2
(45) Date of Patent: Dec. 31, 2019

(54) SEMICONDUCTOR APPARATUS FOR PERFORMING CLOCK PHASE SYNCHRONIZATION, AND AN OPERATING METHOD THEREOF AND SEMICONDUCTOR SYSTEM USING THE SAME

(71) Applicant: SK hynix Inc., Icheon-si, Gyeonggi-do (KR)

(72) Inventors: Seung Hun Lee, Icheon-si (KR); Sang Sic Yoon, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/012,453

(22) Filed: Jun. 19, 2018

(65) Prior Publication Data
US 2019/0131980 A1    May 2, 2019

(30) Foreign Application Priority Data
Oct. 27, 2017    (KR) .................. 10-2017-0140959

(51) Int. Cl.
| | |
|---|---|
| *H03L 7/081* | (2006.01) |
| *H04L 7/033* | (2006.01) |
| *G11C 7/22* | (2006.01) |
| *H04L 7/00* | (2006.01) |
| *G11C 7/10* | (2006.01) |

(52) U.S. Cl.
CPC .......... *H03L 7/0812* (2013.01); *G11C 7/1066* (2013.01); *G11C 7/222* (2013.01); *H04L 7/0008* (2013.01); *H04L 7/0033* (2013.01); *H04L 7/0337* (2013.01)

(58) Field of Classification Search
CPC ..... H03L 7/0814; H03L 7/087; H03L 7/0812; H03L 7/0816; H03L 7/18; H03L 7/07; H03L 7/081; H03L 7/095; H03L 7/10; G11C 7/222; H04L 7/0337
See application file for complete search history.

(56) References Cited

U.S. PATENT DOCUMENTS

| | | | |
|---|---|---|---|
| 8,170,167 B1 | 5/2012 | Roo | |
| 8,306,169 B2 | 11/2012 | Kim et al. | |
| 2009/0174445 A1* | 7/2009 | Kim ................... | G11C 7/1051 327/153 |
| 2009/0322311 A1 | 12/2009 | Qi et al. | |
| 2011/0158030 A1* | 6/2011 | Bae ......................... | G11C 7/22 365/233.1 |

* cited by examiner

*Primary Examiner* — Ross Varndell
(74) *Attorney, Agent, or Firm* — William Park & Associates Ltd.

(57) ABSTRACT

A semiconductor apparatus may include a synchronization circuit, and a phase detection circuit. The synchronization circuit may be configured to, based on an operation mode of the semiconductor apparatus, divide a first clock signal to generate first and second divided clock signals or divide a phase-locked clock signal to generate first and second divided clock signals. The phase detection circuit may be configured to use, based on the operation mode of the semiconductor apparatus, either the first and second clock signals created from dividing the first clock signal or the first and second clock signals created from dividing the phase-locked clock signal, to compare either the first divided clock signal or the second divided clock signal with a second clock signal to generate a phase detection signal.

15 Claims, 5 Drawing Sheets

SEMICONDUCTOR APPARATUS FOR PERFORMING CLOCK PHASE SYNCHRONIZATION, AND AN OPERATING METHOD THEREOF AND SEMICONDUCTOR SYSTEM USING THE SAME

CROSS-REFERENCES TO RELATED APPLICATION

The present application claims priority under 35 U.S.C. § 119(a) to Korean application number 10-2017-0140959, filed on Oct. 27, 2017, in the Korean Intellectual Property Office, which is incorporated herein by reference in its entirety.

BACKGROUND

1. Technical Field

Various embodiments generally relate to a semiconductor technology, and, more particularly, to a semiconductor apparatus for performing clock phase synchronization, and an operating method thereof and a semiconductor system using the same.

2. Related Art

Electronic apparatuses may consist of a large number of electronic components. Among the electronic apparatuses, a computer system may consist of many electronic components which are constructed by semiconductors. The computer system may include various subsystems, and one among them may be a semiconductor system which is configured by a processor and a semiconductor apparatus such as a memory apparatus. The processor and the memory apparatus may perform data communications based on at least one clock signal. As the operation speed of the semiconductor system increases, the frequency of the clock also increases. The processor and the memory apparatus may receive data transmitted from the each other, in synchronization with the clock. That is to say, the processor and the memory apparatus may generate internal data by sampling data using the clock. In the case of sampling data with a clock having a high frequency, a timing margin may be insufficient and thus it may be difficult to sample accurate data. Therefore, the semiconductor apparatus may divide the clock having a high frequency and perform an operation of sampling data with a divided clock.

SUMMARY

Various embodiments are directed to a semiconductor apparatus which receives first and second clock signals and is capable of performing an operation for synchronizing a phase of the first clock signal and a phase of the second clock signal, and an operating method thereof and a semiconductor system using the same.

In an embodiment, a semiconductor apparatus may include: a phase-locked loop circuit configured to perform a phase locking operation on a first clock signal to generate a phase-locked clock signal; a first clock selector configured to output one of the first clock signal and the phase-locked clock signal based on an operation mode signal; a synchronization circuit configured to divide an output of the first clock selector to generate a first divided clock signal and a second divided clock signal which has a phase difference from the first divided clock signal; and a phase detection circuit configured to compare phases of one of the first divided clock signal and the second divided clock signal to a second clock signal, and generate a phase detection signal based on the comparison.

In an embodiment, a method for operating a semiconductor apparatus which receives a first clock signal and a second clock signal from an external apparatus may include: activating a phase-locked loop circuit in a first operation mode; performing a phase locking operation for the first clock signal and generating a phase-locked clock signal by the phase-locked loop circuit; dividing the phase-locked clock signal and generating a first divided clock signal and a second divided clock signal which has a phase difference from the first divided clock signal; detecting whether phases of one of the first divided clock signal and the second divided clock signal and the second clock signal are synchronized, and generating a phase detection signal; and changing a phase of the first clock signal or changing phases of the first and second divided clock signals, based on the phase detection signal.

In another embodiment, a semiconductor apparatus may include a synchronization circuit configured to, based on an operation mode of the semiconductor apparatus, divide a first clock signal to generate first and second divided clock signals or divide a phase-locked clock signal to generate first and second divided clock signals; and a phase detection circuit configured to use, based on the operation mode of the semiconductor apparatus, either the first and second clock signals created from dividing the first clock signal or the first and second clock signals created from dividing the phase-locked clock signal, to compare either the first divided clock signal or the second divided clock signal with a second clock signal to generate a phase detection signal.

DETAILED DESCRIPTION

In this specification "connected with/coupled with" refers to a component directly or indirectly coupled to another component. On the other hand, "directly connected with/directly coupled with" refers to one component directly connecting/coupling another component without an intervening component. Hereinafter, a semiconductor apparatus for performing clock phase synchronization, an operating method thereof and a semiconductor system using the same will be described below with reference to the accompanying drawings through various example embodiments.

Figure 1:
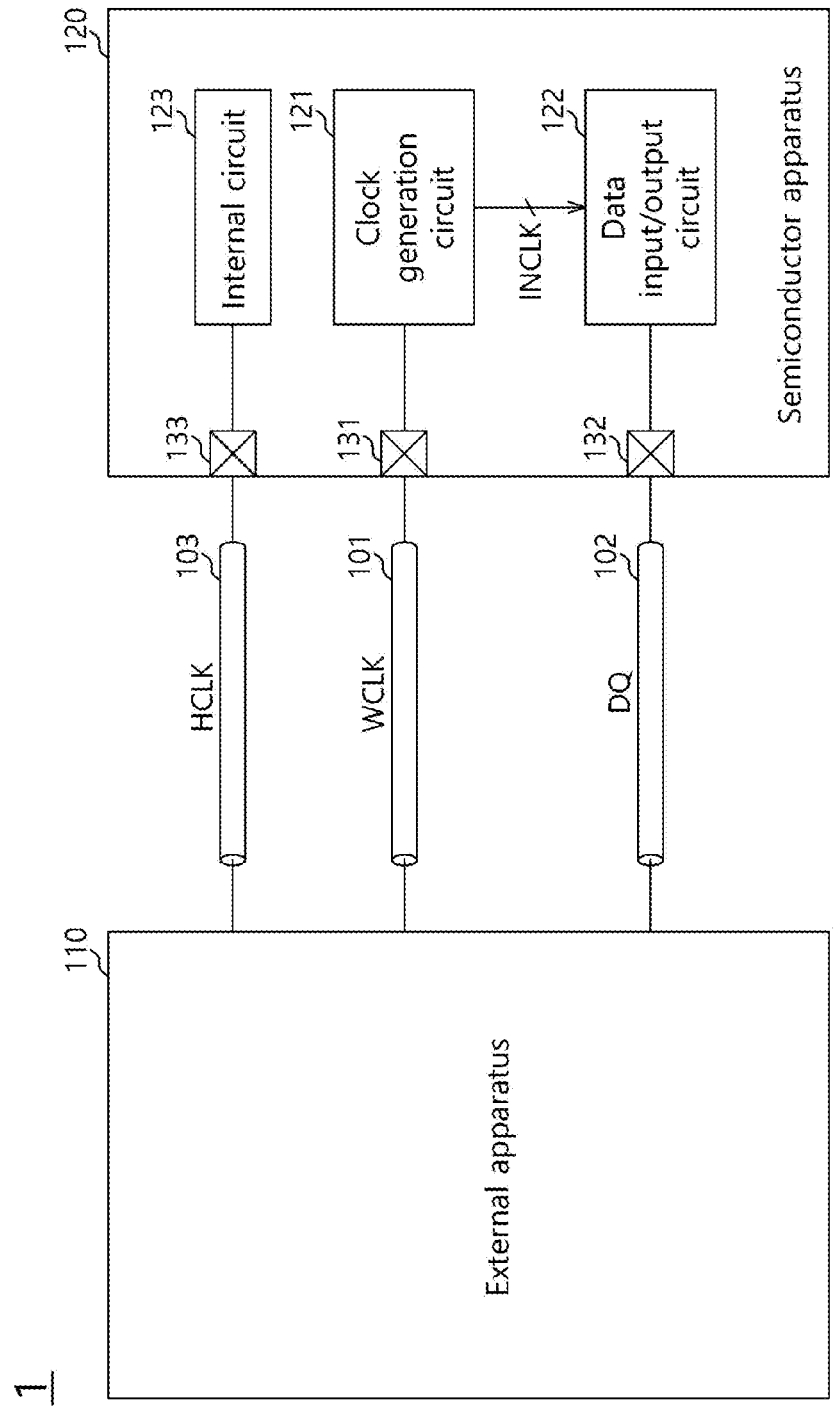
FIG. 1 shows a diagram illustrating a representation of an example configuration of a semiconductor system in accordance with an embodiment.

FIG. 1 illustrates a representation of an example configuration of a semiconductor system 1 in accordance with an embodiment. Referring to FIG. 1, the semiconductor system 1 may include an external apparatus 110 and a semiconductor apparatus 120. The external apparatus 110 may provide various control signals necessary for the semiconductor apparatus 120 to operate. The external apparatus 110 may be various kinds of apparatuses. For example, the external apparatus 110 may be a host apparatus such as a central processing unit (CPU), a graphic processing unit (GPU), a multimedia processor (MMP), a digital signal processor, an application processor AP, and a memory controller. Also, the external apparatus 110 may be a test apparatus or test equipment for testing the semiconductor apparatus 120. The semiconductor apparatus 120 may be, for example, a memory apparatus, and the memory apparatus may include a volatile memory or a nonvolatile memory. The volatile memory may include an SRAM (static RAM), a DRAM (dynamic RAM), or an SDRAM (synchronous DRAM), and the nonvolatile memory may include a ROM (read only memory), a PROM (programmable ROM), an EEPROM (electrically erasable and programmable ROM), an EPROM (electrically programmable ROM), a flash memory, a PRAM (phase change RAM), an MRAM (magnetic RAM), an RRAM (resistive RAM), or an FRAM (ferroelectric RAM).

The semiconductor apparatus 120 may perform a test operation while coupled with the external apparatus 110 functioning as test equipment. The semiconductor apparatus 120 may perform various operations besides the test operation while being coupled with the external apparatus 110 functioning as a host apparatus. For example, after the semiconductor apparatus 120 is manufactured, the semiconductor apparatus 120 may be tested while coupled with the external apparatus 110 functioning as test equipment. After a test is completed, the semiconductor apparatus 120 may perform various operations while coupled with the external apparatus 110 functioning as a host apparatus.

The semiconductor apparatus 120 may be coupled with the external apparatus 110 through a plurality of buses. The plurality of buses may be signal transmission paths, links, or channels for transmitting signals. The plurality of buses may include a command bus, an address bus, a clock bus, and a data bus. FIG. 1 illustrates only clock buses through which clock signals are transmitted and a data bus through which data is transmitted. The clock buses may be unidirectional buses, and the data bus may be a bidirectional bus. The semiconductor apparatus 120 may be coupled with the external apparatus 110 through a first clock bus 101 and receive data clock signals WCLK and WCLKB through the first clock bus 101. The data clock signals WCLK and WCLKB may include a plurality of data clock signal pairs. The data clock signal WCLKB may be a complementary clock signal of the data clock signal WCLK. The semiconductor apparatus 120 may be coupled with the external apparatus 110 through a data bus 102, and may receive data DQ from the external apparatus 110 or transmit data DQ to the external apparatus 110, through the data bus 102. The semiconductor apparatus 120 may further include a second clock bus 103, and may additionally receive a system clock signal HCLK transmitted from the external apparatus 110 through the second clock bus 103.

The semiconductor apparatus 120 may include a clock generation circuit 121, a data input/output circuit 122, and an internal circuit 123. The clock generation circuit 121 may be coupled with the first clock bus 101 through a clock pad 131, and may receive the data clock signals WCLK and WCLKB and generate a plurality of internal clock signals INCLK. In the present embodiment, the frequency of the data clock signal WCLK may be higher than the frequency of the system clock signal HCLK. The semiconductor apparatus 120 may receive data DQ transmitted from the external apparatus 110 or transmit data DQ to the external apparatus 110, in synchronization with the data clock signal WCLK. The semiconductor apparatus 120 may receive and/or sample data DQ transmitted through the data bus 102, with the data clock signal WCLK. In order to sufficiently secure a timing margin for receiving and/or sampling the data DQ, the semiconductor apparatus 120 may use the data clock signal WCLK by dividing the data clock signal WCLK. The clock generation circuit 121 may divide the data clock signal WCLK and generate a plurality of internal clock signals INCLK.

The data input/output circuit 122 may be coupled with the data bus 102 through a data pad 132, and may receive data DQ transmitted from the external apparatus 110 or transmit data DQ to the external apparatus 110. The data input/output circuit 122 may receive a plurality of internal clock signals INCLK generated by the clock generation circuit 121. The data input/output circuit 122 may perform input/output operations on data DQ based on the plurality of internal clock signals INCLK. The data input/output circuit 122 may transmit data DQ to the external apparatus 110 in synchronization with the plurality of internal clock signals INCLK, and may receive the data DQ transmitted from the external apparatus 110 in synchronization with the plurality of internal clock signals INCLK. The internal circuit 123 may include any logic circuit except the clock generation circuit 121 and the data input/output circuit 122 among logic circuits configuring the semiconductor apparatus 120. The internal circuit 123 may be coupled with the second clock bus 103 through a clock pad 133. The internal circuit 123 may receive the system clock signal HCLK through the second clock bus 103. The internal circuit 123 may perform various operations based on the system clock signal HCLK. For example, the internal circuit 123 may receive a control signal such as a command signal from the external apparatus 110 based on the system clock signal HCLK. For example, the semiconductor apparatus 120 may enter a sleep mode or enter an active mode by exiting the sleep mode, based on the received command signal. The sleep mode may include a power-down mode, a standby mode, or a deep power-down mode.

In an embodiment, the external apparatus 110 may transmit the system clock signal HCLK to the semiconductor apparatus 120 regardless of an operation state of the semiconductor apparatus 120. The external apparatus 110 may transmit the data clock signal WCLK when transmitting data DQ to the semiconductor apparatus 120 or when receiving data DQ from the semiconductor apparatus 120. Because the semiconductor apparatus 120 receives the data clock signal WCLK in only a specified period that data is inputted/outputted, a situation may occur in which the phases of the system clock signal HCLK and the data clock signal WCLK do not coincide with each other. Therefore, the semiconductor apparatus 120 may perform an operation of synchronizing a phase of the data clock signal WCLK with a phase of the system clock signal HCLK.

Figure 2:
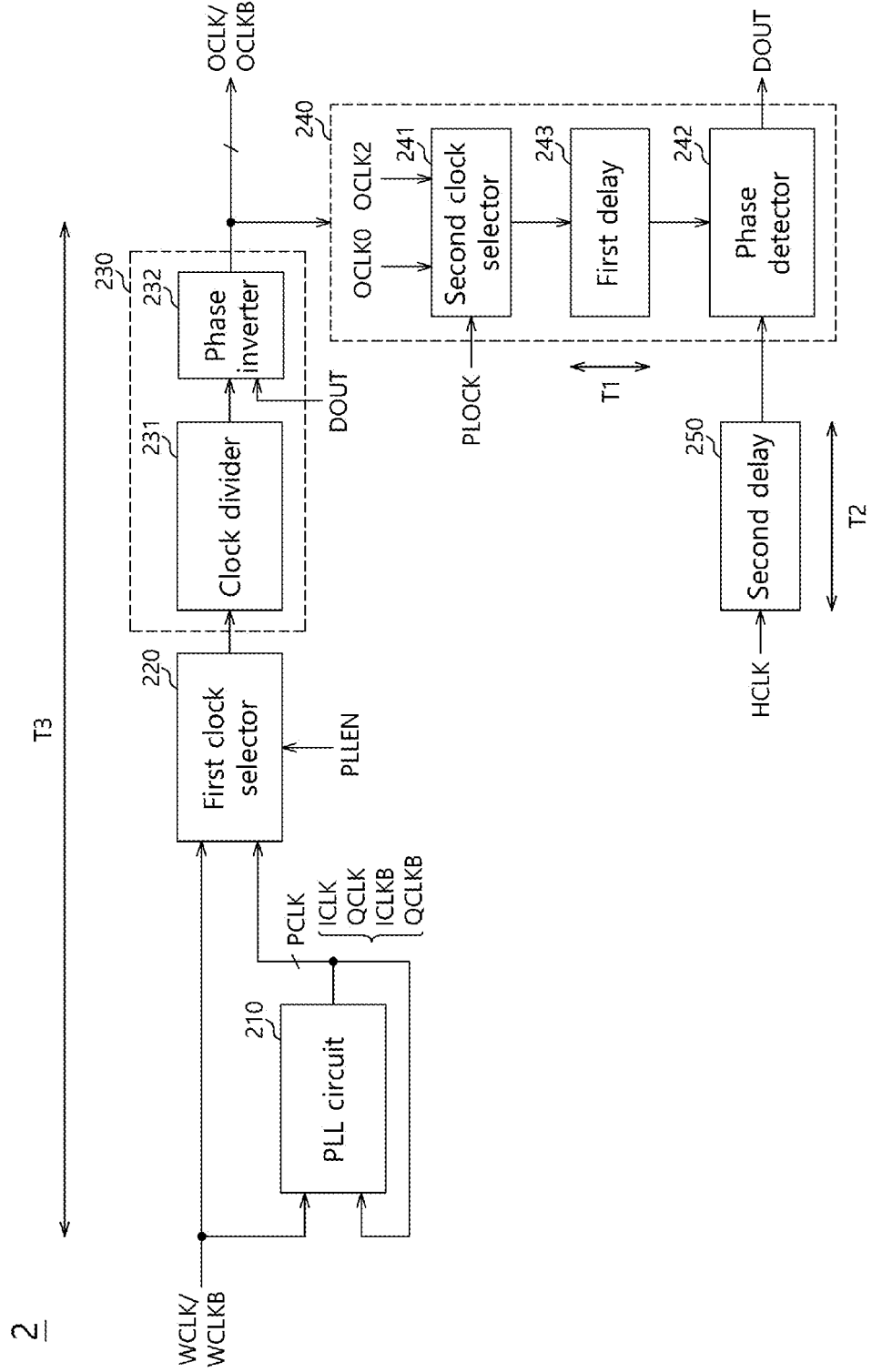
FIG. 2 shows a diagram illustrating a representation of an example configuration of a semiconductor apparatus in accordance with an embodiment.

FIG. 2 illustrates a representation of an example configuration of a semiconductor apparatus 2 in accordance with an embodiment. The semiconductor apparatus 2 may be the semiconductor apparatus 120 illustrated in FIG. 1. The semiconductor apparatus 2 may receive a first clock signal WCLK and a second clock signal HCLK from the external apparatus 110 illustrated in FIG. 1. The first and second clock signals WCLK and HCLK may each be received as a pair of differential clock signals. For example, the first clock signal WCLK may be received together with a complementary signal WCLKB, and the second clock signal HCLK may be received together with a complementary signal HCLKB. The semiconductor apparatus 2 may divide the first clock signal WCLK and generate a plurality of divided clock signals OCLK. The semiconductor apparatus 2 may synchronize the phases of the plurality of divided clock signals OCLK and the second clock signal HCLK. The semiconductor apparatus 2 may operate in first and second operation modes, and may synchronize the phases of the plurality of divided clock signals OCLK and the second clock signal HCLK by using divided clock signals having different phases in the first and second operation modes. The first clock signal WCLK may be, for example, the data clock signal WCLK illustrated in FIG. 1, and the second clock signal HCLK may be the system clock signal HCLK. The plurality of divided clock signals OCLK may be provided as the internal clock signal INCLK.

The semiconductor apparatus 2 may include a phase-locked loop circuit (PLL circuit) 210, a first clock selector 220, a synchronization circuit 230, and a phase detection circuit 240. The phase-locked loop circuit 210 may receive the first clock signal WCLK and perform a phase locking operation on the first clock signal WCLK. The phase-locked loop circuit 210 may generate a plurality of phase-locked clock signals PCLK which have the same frequency as the first clock signal WCLK and the same and/or a constant phase difference. For example, the phase-locked loop circuit 210 may generate first to fourth phase-locked clock signals ICLK, QCLK, ICLKB, and QCLKB from the first clock signal WCLK. The first phase-locked clock signal ICLK may have a synchronized phase with the first clock signal WCLK, and the second to fourth phase-locked clock signals QCLK, ICLKB, and QCLKB may have a constant phase difference from the first to third phase-locked clock signals ICLK, QCLK, and ICLKB, respectively. For example, the second phase-locked clock signal QCLK may have a phase that is 90 degrees behind the first phase-locked clock signal ICLK, the third phase-locked clock signal ICLKB may have a phase that is 90 degrees behind the second phase-locked clock signal QCLK, and the fourth phase-locked clock signal QCLKB may have a phase that is 90 degrees behind the third phase-locked clock signal ICLKB.

In FIG. 2, the semiconductor apparatus 2 may include the first clock selector 220. The first clock selector 220 may receive the first clock signal WCLK and the phase-locked clock signal PCLK. The first clock selector 220 may output one of the first clock signal WCLK or the phase-locked clock signal PCLK based on an operation mode of the semiconductor apparatus 2. For example, the first clock selector 220 may output the phase-locked clock signal PCLK generated from the phase-locked loop circuit 210 in the first operation mode, or may output the first clock signal WCLK in the second operation mode. The first operation mode may be an operation mode in which the phase-locked loop circuit 210 is activated, and the second operation mode may be an operation mode in which the phase-locked loop circuit 210 is deactivated. An operation mode signal PLLEN may be used to identify the first operation mode and the second operation mode. The operation mode signal PLLEN may be a phase-locked loop enable signal for activating an operation of the phase-locked loop circuit 210. The first clock selector 220 may output one of the first clock signal WCLK and the phase-locked clock signal PCLK based on the operation mode signal PLLEN. The first clock selector 220 may be embodied as a multiplexer which receives the operation mode signal PLLEN as a control signal and outputs one of the first clock signal WCLK and the phase-locked clock signal PCLK based on the operation mode signal PLLEN.

The synchronization circuit 230 may receive the output of the first clock selector 220. The synchronization circuit 230 may divide the output of the first clock selector 220 and generate a plurality of divided clock signals OCLK. The synchronization circuit 230 may divide the output of the first clock selector 220 and generate at least a first divided clock signal OCLK0 and a second divided clock signal OCLK2. In the first operation mode, the synchronization circuit 230 may receive the phase-locked clock signal PCLK from the first clock selector 220, divide the phase-locked clock signal PCLK and generate the plurality of divided clock signals OCLK. In the second operation mode, the synchronization circuit 230 may receive the first clock signal WCLK from the first clock selector 220, divide the first clock signal WCLK and generate the plurality of divided clock signals OCLK. The plurality of divided clock signals OCLK including the first and second divided clock signals OCLK0 and OCLK2 may have a lower frequency than the first clock signal WCLK. For example, the frequency of the plurality of divided clock signals OCLK may be half the frequency of the first clock signal WCLK. In one example, the second divided clock signal OCLK2 may have a phase difference of 90 degrees from the first divided clock signal OCLK0. The synchronization circuit 230 may change the phases of the plurality of divided clock signals OCLK. The synchronization circuit 230 may change the phases of the plurality of divided clock signals OCLK based on a phase detection signal DOUT generated from the phase detection circuit 240. In one embodiment, the synchronization circuit 230 may be directly coupled to the phase-locked loop circuit 210 and inputs/functions of the first clock selector 220 may be received/performed by the synchronization circuit 230. In another embodiment the phase-locked loop circuit 210 may be coupled to the first clock selector 220 and the first clock selector 220 may be coupled to the synchronization circuit 230.

The phase detection circuit 240 may receive the first and second divided clock signals OCLK0 and OCLK2 among the plurality of divided clock signals OCLK, and may receive the second clock signal HCLK. The phase detection circuit 240 may compare the phases of at least one of the first and second divided clock signals OCLK0 and OCLK2 and the second clock signal HCLK and generate the phase detection signal DOUT. The phase detection circuit 240 may compare the phase of the first divided clock signal OCLK0 and the phase of the second clock signal HCLK and generate the phase detection signal DOUT, and may compare the phase of the second divided clock signal OCLK2 and the phase of the second clock signal HCLK and generate the phase detection signal DOUT. The phase detection circuit 240 may perform the phase comparison operation based on the operation of the phase-locked loop circuit 210. For example, the phase detection circuit 240 may compare the phases of at least one of the first and second divided clock signals OCLK0 and OCLK2 and the second clock signal HCLK based on whether or not the phase-locked loop circuit 210 is locked, and generate the phase detection signal DOUT based on a result of the comparison. When the phase-locked loop circuit 210 is not locked, the phase detection circuit 240 may compare the phase of the first divided clock signal OCLK0 and the phase of the second clock signal HCLK, and generate the phase detection signal DOUT based on a result of the comparison. When the phase-locked loop circuit 210 is locked, the phase detection circuit 240 may compare the phase of the second divided clock signal OCLK2 and the phase of the second clock signal HCLK, and generate the phase detection signal DOUT based on a result of the comparison. The phase detection circuit 240 may provide the phase detection signal DOUT to the synchronization circuit 230. In an embodiment, the phase detection circuit 240 may output the phase detection signal DOUT to the external apparatus 110 illustrated in FIG. 1. The phase detection signal DOUT may be transmitted to the external apparatus 110 through the data pad 132 and the data bus 102 illustrated in FIG. 1. In an embodiment, the phase detection signal DOUT may be transmitted to the external apparatus 110 through an error detection signal pad and an error detection signal bus for the semiconductor apparatus 2 to transmit an error detection signal to the external apparatus 110.

Referring to FIG. 2, the synchronization circuit 230 may include a clock divider 231 and a phase inverter 232. The clock divider 231 may receive the output of the first clock selector 220. The clock divider 231 may frequency-divide the output of the first clock selector 220 and generate the plurality of divided clock signals OCLK. The clock divider 231 may be, for example, a divider which divides by two the frequency of the first clock signal WCLK or the phase-locked clock signal PCLK, but embodiments are not limited thereto. The clock divider 231 may be a divider which divides by four the frequency of the first clock signal WCLK or the phase-locked clock signal PCLK. The phase inverter 232 may receive the plurality of divided clock signals OCLK which are generated from the clock divider 231, and may receive the phase detection signal DOUT which is generated from the phase detection circuit 240. The phase inverter 232 may invert the phases of the plurality of divided clock signals OCLK based on the phase detection signal DOUT, and output resultant signals. For example, when the phase detection signal DOUT is a first level, the phase inverter 232 may invert phases of the plurality of divided clock signals OCLK and output a plurality of inverted divided clock signals OCLKB. When the phase detection signal DOUT is a second level, the phase inverter 232 might not invert the phases of the plurality of divided clock signals OCLK and may output the plurality of divided clock signals OCLK as they are.

In FIG. 2, the phase detection circuit 240 may include a second clock selector 241 and a phase detector 242. The second clock selector 241 may receive the plurality of divided clock signals OCLK from the synchronization circuit 230. The second clock selector 241 may receive the first divided clock signal OCLK0 and the second divided clock signal OCLK2 from the synchronization circuit 230. The second clock selector 241 may also receive a locking signal PLOCK from the phase-locked loop circuit 210. The locking signal PLOCK may be generated based on whether or not the phase-locked loop circuit 210 is locked. The phase-locked loop circuit 210 may enable the locking signal PLOCK when the phase locking operation for the first clock signal WCLK completes. The second clock selector 241 may output the first divided clock signal OCLK0 when the locking signal PLOCK is in a disabled state. The second clock selector 241 may output the second divided clock signal OCLK2 when the locking signal PLOCK is in an enabled state. The second clock selector 241 may be embodied as a multiplexer which receives the locking signal PLOCK as a control signal and outputs one of the first and second divided clock signals OCLK0 and OCLK2.

The phase detector 242 may receive the output of the second clock selector 241 and the second clock signal HCLK. The phase detector 242 may compare the phases of the output of the second clock selector 241 and the second clock signal HCLK, and generate the phase detection signal DOUT based on the comparison. For example, the phase detector 242 may generate the phase detection signal DOUT including information on whether the phase of the output of the second clock selector 241 precedes or follows the phase of the second clock signal HCLK. In an embodiment, the phase detector 242 may output the phase detection signal DOUT as a digital signal code having a plurality of bits, and the phase detection signal DOUT may include information on a phase difference between the second clock signal HCLK and the first divided clock signal OCLK0, or information on a phase difference between the second clock signal HCLK and the second divided clock signal OCLK2.

The phase detection circuit 240 may also include a first delay 243. The first delay 243 may receive output of the second clock selector 241 and delay the output of the second clock selector 241 by a first time T1. The first delay 243 may be provided to compensate for a delay created by the generation of the plurality of divided clock signals OCLK. The first delay 243 may be provided to allow the phase detector 242 to perform a phase comparison between the output of the second clock selector 241 and the second clock signal HCLK at a precise timing. The first delay 243 and the first time T1 will be described below.

Referring to FIG. 2, the semiconductor apparatus 2 may further include a second delay 250. The second delay 250 may receive the second clock signal HCLK and delay a phase of the second clock signal HCLK by a second time T2. When a delay time until the first and second divided clock signals OCLK0 and OCLK2 are generated from the first clock signal WCLK is a third time T3, the first time T1 may be a value that is obtained by subtracting the third time T3 from the second time T2. Therefore, a delay time as the first clock signal WCLK is divided and reaches the phase detector 242 and a delay time as the second clock signal HCLK reaches the phase detector 242 may be substantially the same, and the phase detector 242 may compare the phases of the first and second divided clock signals OCLK0 and OCLK2 and the phase of the second clock signal HCLK at a precise timing and generate the phase detection signal DOUT.

Figure 3:
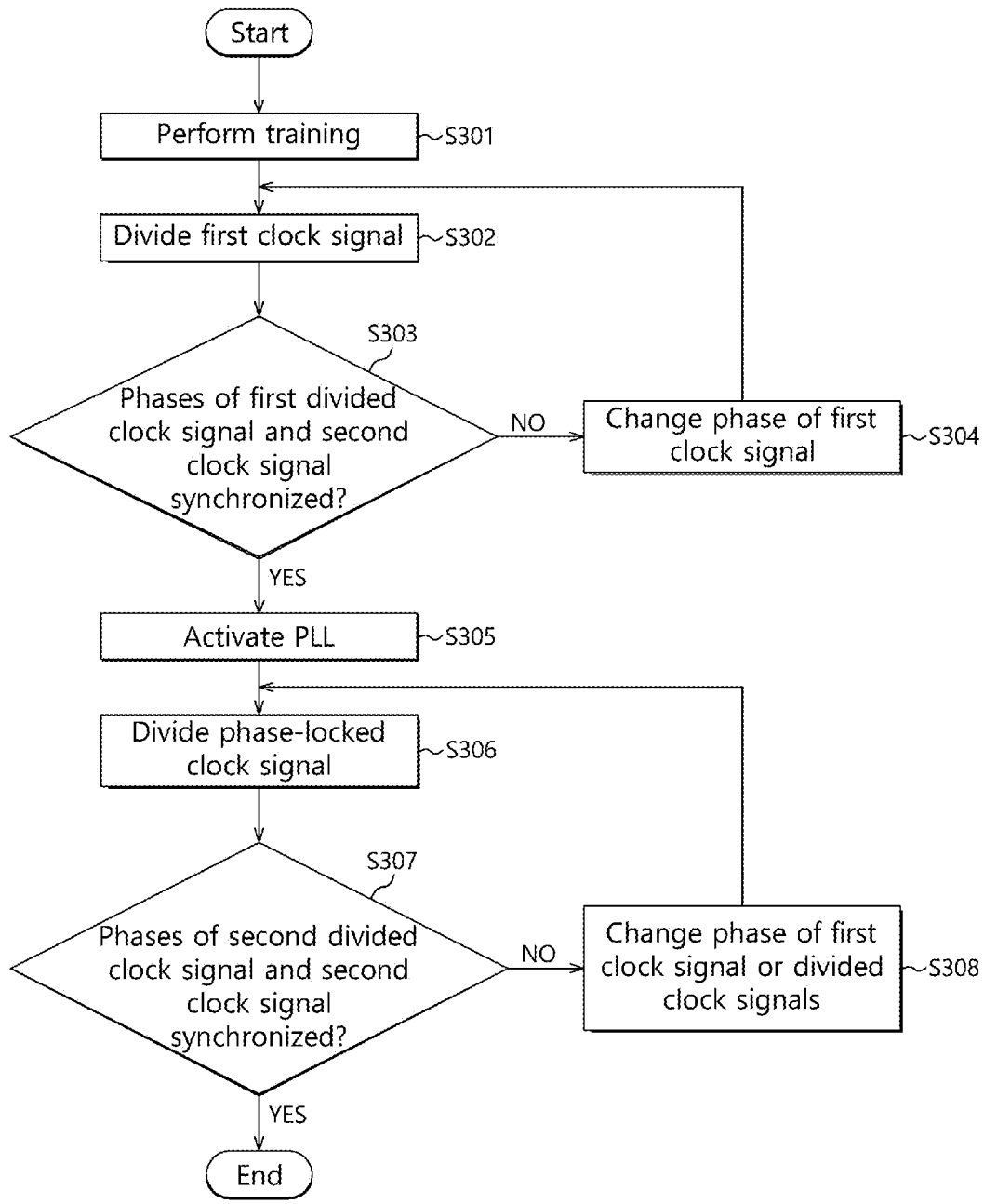
FIG. 3 shows a representation of an example flow chart to assist in an explanation of an operation of the semiconductor apparatus in accordance with an embodiment.
Figure 4:
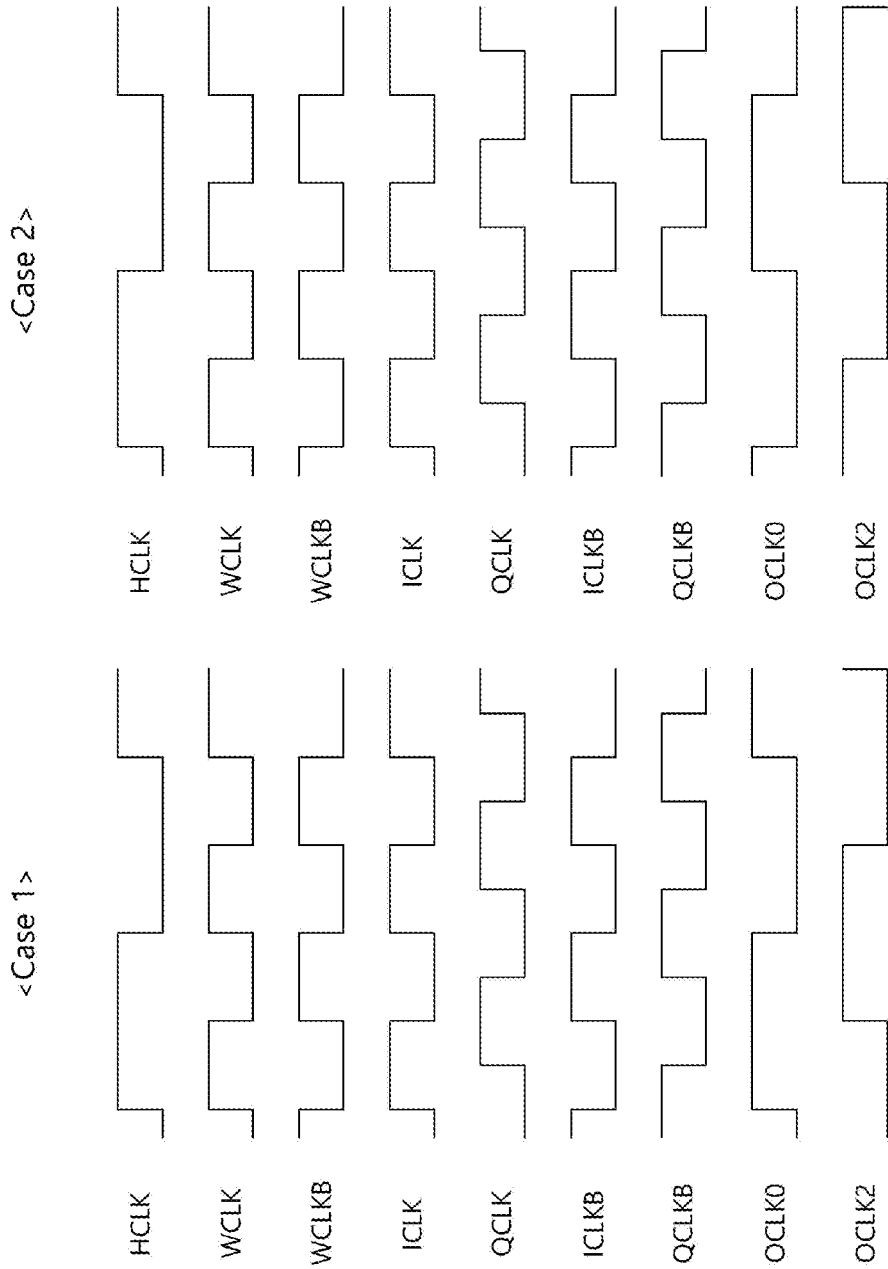
FIGS. 4 and 5 show representations of example diagrams to assist in an explanation of an operation of the semiconductor apparatus in accordance with an embodiment.
Figure 5:
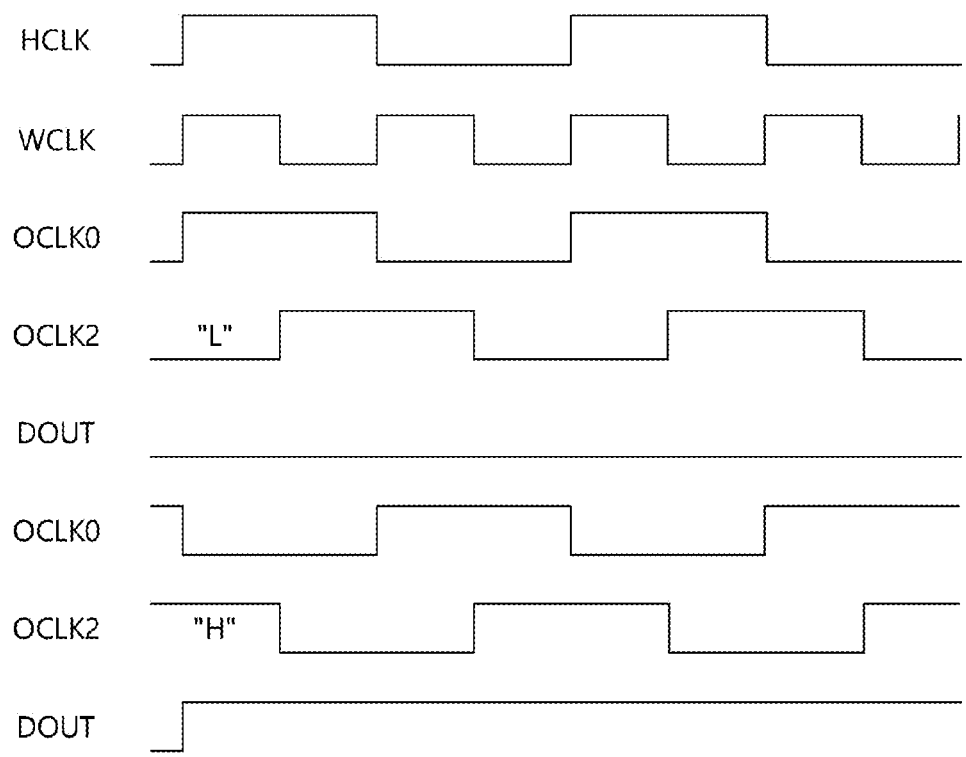

FIG. 3 shows a representation of an example flow chart to assist in an explanation of an operation of the semiconductor apparatus 2 in accordance with an embodiment. FIGS. 4 and 5 show representations of example timing diagrams to assist in an explanation of the operation of the semiconductor apparatus 2 in accordance with an embodiment. The operation of the semiconductor apparatus 2 in accordance with an embodiment will be described below with reference to FIGS. 1 to 5. The external apparatus 110 may provide the first clock signal WCLK and the second clock signal HCLK to the semiconductor apparatus 2. The semiconductor apparatus 2 may perform a training operation when the first clock signal WCLK is received therein (S301). The training operation may be an operation of synchronizing the phase of the first clock signal WCLK with the phase of the second clock signal HCLK. An operation mode in which the training operation is performed may be the second operation mode. In the second operation mode, the operation mode signal PLLEN may be disabled. Therefore, the first clock selector 220 may output the first clock signal WCLK. The clock divider 231 may divide the first clock signal WCLK and generate the plurality of divided clock signals OCLK (S302).

Because the phase-locked loop circuit 210 is deactivated when the operation mode signal PLLEN is in the disabled state, the locking signal PLOCK generated from the phase-locked loop circuit 210 may also be disabled. The second clock selector 241 may output the first divided clock signal OCLK0. The phase detector 242 may compare the phases of the first divided clock signal OCLK0 and the second clock signal HCLK and generate the phase detection signal DOUT based on the comparison (S303). When the phases of the first divided clock signal OCLK0 and the second clock signal HCLK are not synchronized, the phase detector 242 may transmit the phase detection signal DOUT to the external apparatus 110 and the external apparatus 110 may change the phase of the first clock signal WCLK based on the phase detection signal DOUT (S304).

The first clock signal WCLK may be transmitted while the second clock signal HCLK is transmitted. There may be a case where the first clock signal WCLK is synchronized with the second clock signal HCLK, a case where the first clock signal WCLK has a phase difference of 90 degrees from the second clock signal HCLK, a case where the first clock signal WCLK has a phase difference of 180 degrees from the second clock signal HCLK, and a case where the first clock signal WCLK has a phase difference of 270 degrees from the second clock signal HCLK. In an embodiment, the external apparatus 110 may change the phase of the first clock signal WCLK in a stepwise manner based on the phase detection signal DOUT. For example, the external apparatus 110 may change the phase of the first clock signal WCLK by 90 degrees based on the phase detection signal DOUT. In an embodiment, the phase detection signal DOUT may be a digital signal code which has a plurality of bits, and the external apparatus 110 may change the phase of the first clock signal WCLK based on a phase difference between the first clock signal WCLK and the second clock signal HCLK. As the external apparatus 110 provides the first clock signal WCLK having a changed phase, the first divided clock signal OCLK0 may have its phase synchronized with the second clock signal HCLK. When the phases of the first divided clock signal OCLK0 and the second clock signal HCLK are synchronized, the semiconductor apparatus 2 may enter the first operation mode. In the first operation mode, the operation mode signal PLLEN may be enabled, and the phase-locked loop circuit 210 may be activated (S305). The phase-locked loop circuit 210 may perform the phase locking operation on the first clock signal WCLK, and output the phase-locked clock signal PCLK. If the phase locking operation is completed, the phase-locked loop circuit 210 may generate the locking signal PLOCK. The first clock selector 220 may output the phase-locked clock signal PCLK based on the operation mode signal PLLEN. The clock divider 231 may divide the phase-locked clock signal PCLK and generate the first and second divided clock signals OCLK0 and OCLK2 (S306).

FIG. 4 is a timing diagram showing a problem that may occur when the first and second divided clock signals OCLK0 and OCLK2 are generated based on the four phase-locked clock signals ICLK, QCLK, ICLKB, and QCLKB. The phase-locked loop circuit 210 may receive the first clock signal WCLK, perform the phase locking operation on the first clock signal WCLK, and generate the first to fourth phase-locked clock signals ICLK, QCLK, ICLKB, and QCLKB. As illustrated in FIG. 4, the first to fourth phase-locked clock signals ICLK, QCLK, ICLKB, and QCLKB may have a phase difference of 90 degrees from one another. In the first operation mode, the first clock selector 220 may output the first to fourth phase-locked clock signals ICLK, QCLK, ICLKB, and QCLKB to the synchronization circuit 230 based on the operation mode signal PLLEN. There may be a case (Case 1) where the clock divider 231 generates the plurality of divided clock signals OCLK in synchronization with the first phase-locked clock signal ICLK and a case (Case 2) where the clock divider 231 generates the plurality of divided clock signals OCLK based on the third phase-locked clock signal ICLKB. When the clock divider 231 generates the plurality of divided clock signals OCLK based on the first phase-locked clock signal ICLK (Case 1) the first divided clock signal OCLK0 may be synchronized with the second clock signal HCLK, because the phase of the first divided clock signal OCLK0 is synchronized with a phase of the first phase-locked clock signal ICLK. Conversely, when the clock divider 231 generates the plurality of divided clock signals OCLK based on the third phase-locked clock signal ICLKB (Case 2) the first divided clock signal OCLK0 may have a phase opposite to the first clock signal WCLK and the second clock signal HCLK, because the phase of the first divided clock signal OCLK0 is synchronized with the phase of the third phase-locked clock signal ICLKB. In order to detect the above two cases, the phase detection circuit 240 may compare the phase of the second divided clock signal OCLK2 instead of the first divided clock signal OCLK0 with the second clock signal HCLK.

Again, in FIG. 3, the second clock selector 241 may output the second divided clock signal OCLK2. The phase detector 242 may compare the phases of the second divided clock signal OCLK2 and the second clock signal HCLK and generate the phase detection signal DOUT in the first operation mode (S307). As shown in FIG. 5, if the phases of the first divided clock signal OCLK0 and the second clock signal HCLK are synchronized when the phase of the second clock signal HCLK is a high level in the second operation mode, the level of the second divided clock signal OCLK2 may be a low level. Therefore, the phase detector 242 may generate the phase detection signal DOUT which has a low level, and the phase synchronization operation of the semiconductor apparatus 2 may end.

Referring to FIG. 5, if the phases of the first divided clock signal OCLK0 and the second clock signal HCLK are not synchronized when the phase of the second clock signal HCLK is a high level, the level of the second divided clock signal OCLK2 may also be a high level. The phase detector 242 may generate the phase detection signal DOUT which has a high level. In an embodiment, to synchronize the phase of the first divided clock signal OCLK0 and the phase of the second clock signal HCLK, the phase of one of the first clock signal WCLK and the plurality of divided clock signals OCLK may be changed based on the phase detection signal DOUT (S308). In an embodiment, the phase detection signal DOUT may be inputted to the phase inverter 232. The phase inverter 232 may invert the phase of the divided clock signal OCLK based on the phase detection signal DOUT, and the inverted divided clock signal OCLKB may be synchronized with the phase of the second clock signal HCLK. Accordingly, the phase synchronization operation may be performed automatically in the semiconductor apparatus 2. In an embodiment, the phase detection signal DOUT may alternatively be provided to the external apparatus 110. The external apparatus 110 may invert the phase of the first clock signal WCLK or change the phase of the first clock signal WCLK by 180 degrees based on the phase detection signal DOUT. Therefore, the phase of the divided clock signal OCLK may be synchronized with the phase of the second clock signal HCLK.

While various embodiments have been described above, it will be understood to those skilled in the art that the embodiments described are examples only. Accordingly, the semiconductor apparatus for performing clock phase synchronization, the operating method thereof and the semiconductor system using the same described herein should not be limited based on the described embodiments.

What is claimed is:

1. A semiconductor apparatus comprising:
a phase-locked loop circuit configured to perform a phase locking operation on a first clock signal to generate a phase-locked clock signal;
a first clock selector configured to output one of the first clock signal and the phase-locked clock signal based on an operation mode signal;
a synchronization circuit configured to divide an output of the first clock selector to generate a first divided clock signal and a second divided clock signal which has a phase difference from the first divided clock signal;
a second clock selector configured to output one of the first divided clock signal and the second divided clock signal based on whether or not the phase-locked loop circuit is locked; and
a phase detector configured to compare an output of the second clock selector and the second clock signal, and generate the phase detection signal based on the comparison.

2. The semiconductor apparatus according to claim 1, wherein the first clock signal has a higher frequency than the second clock signal, and the first and second divided clock signals have lower frequencies than the first clock signal.

3. The semiconductor apparatus according to claim 1, wherein the second divided clock signal has a phase difference of 90 degrees from the first divided clock signal.

4. The semiconductor apparatus according to claim 1, wherein the synchronization circuit comprises:
a clock divider configured to divide the phase-locked clock signal and generate the first and second divided clock signals; and
a phase inverter configured to invert phases of the first and second divided clock signals based on the phase detection signal, and output resultant signals.

5. The semiconductor apparatus according to claim 1, wherein the phase detection circuit further comprises:
a first delay configured to delay an output of the second clock selector by a first time.

6. The semiconductor apparatus according to claim 1, further comprising:
a second delay configured to delay the phase of the second clock signal by a second time.

7. The semiconductor apparatus according to claim 6, wherein a delay time until the first and second divided clock signals are generated from the first clock signal is a third time, and the first time corresponds to a value that is obtained by subtracting the third time from the second time.

8. The semiconductor apparatus according to claim 6, wherein the operation mode signal is a phase-locked loop enable signal which activates an operation of the phase-locked loop circuit.

9. A method for operating a semiconductor apparatus which receives a first clock signal and a second clock signal from an external apparatus, comprising:
activating a phase-locked loop circuit in a first operation mode;
performing a phase locking operation for the first clock signal and generating a phase-locked clock signal by the phase-locked loop circuit;
dividing the phase-locked clock signal and generating a first divided clock signal and a second divided clock signal which has a phase difference from the first divided clock signal;
outputting one of the first divided clock signal and the second divided clock signal based on whether or not the phase-locked loop circuit is locked;
comparing one of the first divided clock signal and the second divided clock signal outputted from the outputting to a phase of the second clock signal, and generating the phase detection signal based on the comparison; and
changing a phase of the first clock signal or changing phases of the first and second divided clock signals, based on the phase detection signal.

10. The method according to claim 9, wherein the first clock signal has higher frequency than the second clock signal, and the first and second divided clock signals has lower frequencies than the first clock signal.

11. The method according to claim 9, wherein changing the phase of the first clock signal comprises:
transmitting the phase detection signal to the external apparatus; and
changing the phase of the first clock signal by the external apparatus.

12. The method according to claim 9, wherein the changing of the phases of the first and second divided clock signals comprises:
inverting the phases of the first and second divided clock signals based on the phase detection signal.

13. The method according to claim 9, further comprising:
dividing the first clock signal in a second operation mode, and generating the first and second divided clock signals in the second operation mode.

14. The method according to claim 13, wherein the phase-locked loop circuit is deactivated in the second operation mode.

15. The method according to claim 13, wherein the generating of the phase detection signal includes detecting whether the phases of the second divided clock signal and the second clock signal are synchronized in the first operation mode, and detecting whether the phases of the first divided clock signal and the second clock signal are synchronized in the second operation mode.

* * * * *